(12) United States Patent
Loeb et al.

(10) Patent No.: US 8,044,716 B1
(45) Date of Patent: Oct. 25, 2011

(54) ADJUSTABLE SEGMENTED POWER AMPLIFIER

(75) Inventors: Wayne Loeb, San Francisco, CA (US); King Chun Tsai, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/984,477

(22) Filed: Jan. 4, 2011

Related U.S. Application Data

(63) Continuation of application No. 12/212,598, filed on Sep. 17, 2008, now Pat. No. 7,863,976, which is a continuation of application No. 10/776,476, filed on Feb. 10, 2004, now Pat. No. 7,444,124.

(60) Provisional application No. 60/470,686, filed on May 14, 2003.

(51) Int. Cl.
*H03F 1/14* (2006.01)
(52) U.S. Cl. .......................... 330/51; 330/302; 330/310
(58) Field of Classification Search .................... 330/51, 330/98, 133, 302, 310
See application file for complete search history.

(56) References Cited

U.S. PATENT DOCUMENTS

| | | | |
|---|---|---|---|
| 5,132,637 A * | 7/1992 | Swanson | ........................ 330/149 |
| 5,256,987 A | 10/1993 | Kibayashi et al. | |
| 5,343,162 A | 8/1994 | Davis | |
| 5,602,508 A | 2/1997 | Endou et al. | |
| 5,760,646 A | 6/1998 | Belcher et al. | |
| 5,872,481 A | 2/1999 | Sevic et al. | |
| 5,974,041 A | 10/1999 | Kornfeld et al. | |
| 5,990,750 A | 11/1999 | Katz | |
| 6,137,355 A | 10/2000 | Sevic et al. | |
| 6,285,255 B1 * | 9/2001 | Luu et al. | ........................ 330/10 |
| 6,304,140 B1 | 10/2001 | Thron et al. | |
| 6,356,146 B1 | 3/2002 | Wright et al. | |
| 6,400,227 B1 | 6/2002 | Goldfarb et al. | |
| 6,459,334 B2 | 10/2002 | Wright et al. | |
| 6,463,269 B2 | 10/2002 | DeMarco | |
| 6,476,670 B1 | 11/2002 | Wright et al. | |
| 6,486,733 B2 | 11/2002 | Myers et al. | |

(Continued)

FOREIGN PATENT DOCUMENTS

EP 1-187-314 A1 3/2002

(Continued)

OTHER PUBLICATIONS

IEEE Computer Society and the IEEE Microwave Theory and Techniques Society; "Part 16: Air Interface for Fixed Broadband and Wireless Access Systems"; IEEE Standards for Local and Metropolitan Area Networks; Oct. 1, 2004; IEEE Std 802.16-2004; Institute of Electrical and Electronics Engineers, Inc. New York, NY.

*Primary Examiner* — Khanh Nguyen

(57) ABSTRACT

An adjustable, segmented amplifier including (i) a first fixed stage configured to amplify an analog signal in accordance with a fixed amplification, and provide the analog signal amplified in accordance with the fixed amplification to a first common node. The adjustable, segmented amplifier further includes an adjustable stage comprising a plurality of independently selectable parallel amplifier segments, wherein the adjustable stage is configured to (i) amplify the analog signal provided to the first common node in accordance with an adjustable amplification that is adjustable depending upon a number of the independently selectable parallel amplifier segments having been selected to amplify the analog signal provided to the first common node, and (ii) provide the analog signal amplified in accordance with the fixed amplification and amplified in accordance with the adjustable amplification to the second common node.

16 Claims, 7 Drawing Sheets

U.S. PATENT DOCUMENTS

| | | |
|---|---|---|
| 6,512,417 B2 | 1/2003 | Booth et al. |
| 6,538,515 B2 | 3/2003 | Brandt |
| 6,545,535 B2 | 4/2003 | Andre |
| 6,600,792 B2 | 7/2003 | Antonio et al. |
| 6,639,463 B1 | 10/2003 | Ghanadan et al. |
| 6,804,500 B2 | 10/2004 | Yamaguchi |
| 6,897,732 B2 | 5/2005 | Iwai |
| 6,996,379 B2 | 2/2006 | Khorram |
| 7,187,231 B2 | 3/2007 | McGrath et al. |
| 2002/0005760 A1 | 1/2002 | Masahiro |
| 2002/0008575 A1 | 1/2002 | Oskowsky et al. |
| 2002/0101937 A1 | 8/2002 | Antonio et al. |
| 2002/0186783 A1 | 12/2002 | Opas et al. |
| 2003/0025553 A1 | 2/2003 | Faris |
| 2003/0063686 A1 | 4/2003 | Giardina et al. |
| 2003/0095012 A1 | 5/2003 | Chethik et al. |
| 2003/0104794 A1 | 6/2003 | Yang et al. |
| 2004/0095190 A1 | 5/2004 | Klaren et al. |
| 2004/0189399 A1 | 9/2004 | Hu et al. |

FOREIGN PATENT DOCUMENTS

| | | |
|---|---|---|
| EP | 1-280-273 A2 | 1/2003 |

\* cited by examiner

ADJUSTABLE SEGMENTED POWER AMPLIFIER

RELATED APPLICATIONS

This application is a continuation of U.S. application Ser. No. 12/212,598, filed Sep. 17, 2008, which is a continuation of U.S. application Ser. No. 10/776,476, filed Feb. 10, 2004, which claims the benefit of U.S. Provisional Application No. 60/470,686, filed May 14, 2003. The disclosures of the applications referenced above are incorporated herein by reference.

FIELD OF THE INVENTION

The present invention generally relates to the field of power amplification. More specifically, embodiments of the present invention pertain to an adjustable, segmented power amplifier, circuitry, architectures, and devices including such a power amplifier, and methods for operating such a power amplifier.

DISCUSSION OF THE BACKGROUND

Radio frequency (RE) transmitters in wireless networks are generally required to operate in a linear region of a power-vs.-gain curve. If the transmitter is used in a system over a range of transmission power, linearity is generally measured by how the output gain (e.g., the P1 dB, or 1 dB compression point with reference to the output power) scales as a function of output power. For example, as the transmitter power is lowered, the P1 dB requirement is also reduced, and the power amplifier power dissipation should also be reduced for efficient operation.

To achieve optimal efficiency, circuit designers typically design a power amplifier to be as efficient as possible while meeting the linearity requirements. For a bipolar power amplifier (such as those typically used in RE transmitters), an optimal bias point is the bias at which the class B effect of low power signal gain expansion cancels or offsets the class A effect of high-power signal gain compression. This optimal class A/B bias point can also be represented as an optimal voltage at the base of the bipolar amplifier transistor or an optimal emitter current density in the bipolar power amplifier. The designer therefore scales amplifier device sizes such that sufficient power is provided to the load at the amplifier output (which may be scaled with an impedance network to maximize amplifier efficiency). For a fixed transistor size and a given optimal quiescent current density, efficient operation is possible only over a relatively small transmission power range, and maximum efficiency is possible only at a single transmission power.

If one could change the size of the bipolar device(s) in the amplifier, one could maintain the optimal emitter current density over a relatively large output power range. For example, one may wish to implement a low power mode (e.g., where the output is in the range of from 0 to 10 dBm), in addition to a "normal operation" mode (e.g., where the output is in the range of from 10 to 20 dBm). However, once the bipolar amplifier is manufactured, the size of the devices generally cannot be changed, thereby effectively preventing the same power amp from providing highly efficient low power and "normal operation" modes.

One approach to providing power amplification over a range exceeding the linear range of a single amplifier has employed multiple amplifiers, each having a different linear range of operation. In this approach, one simply selects the appropriate amplifier for the power range in which one is operating. However, such an approach consumes a relatively large chip area, in comparison to single amplifier designs. Furthermore, this approach typically introduces a digital or CMOS switch in the RF signal path, thereby introducing (i) non-linearities into the signal amplification function and/or (ii) attenuation and/or insertion loss into the signal itself.

Another approach has varied the bias applied to the power amp. While this approach extends the efficient range of operation, it does so at the cost of reduced linearity and potentially unacceptable linearity at the lower end of the output power range. Thus, a need is felt for a power amplifier that operates efficiently over a large output power range and that does not consume an inordinate amount of chip area.

SUMMARY

Embodiments of the present invention relate to adjustable, segmented amplifier circuits and architectures, systems including such an amplifier, and methods for amplifying an analog signal using such an amplifier. The circuits and/or architectures generally comprise (a) a first fixed stage configured to amplify an analog signal and provide a first amplified output at a first common node; and (b) an adjustable stage comprising a plurality of independently selectable parallel amplifier segments, each of the parallel amplifier segments having an input at the first common node and an output at a second common node, wherein the adjustable stage is configured to provide a unique high-efficiency output power range corresponding to a unique number of selected parallel amplifier segments. The systems generally comprise an integrated circuit (IC) that includes the present amplifier circuit and/or architecture embodying one or more of the inventive concepts disclosed herein. The methods generally comprise the steps of (1) amplifying the analog signal in a fixed amplifier stage, (2) selecting a number of parallel amplifier segments for subsequent signal amplification, and (3) amplifying the amplified analog signal with the activated parallel, selectable amplifier segments to generate an output signal in one of a plurality of predetermined output power ranges corresponding to the number of selected parallel amplifier segments.

The present invention advantageously provides a power amplifier that operates efficiently over a large output power range, that exhibits unconditional stability over a wide output power range, and that does not consume an inordinate amount of chip area. Furthermore, in certain preferred embodiments, the present amplifier exhibits excellent input and/or output matching and/or an insignificant and/or immaterial degree of parameter variability, regardless of the number of parallel output segments that are selected for operation. These and other advantages of the present invention will become readily apparent from the detailed description of preferred embodiments below.

DETAILED DESCRIPTION

Figure 1:
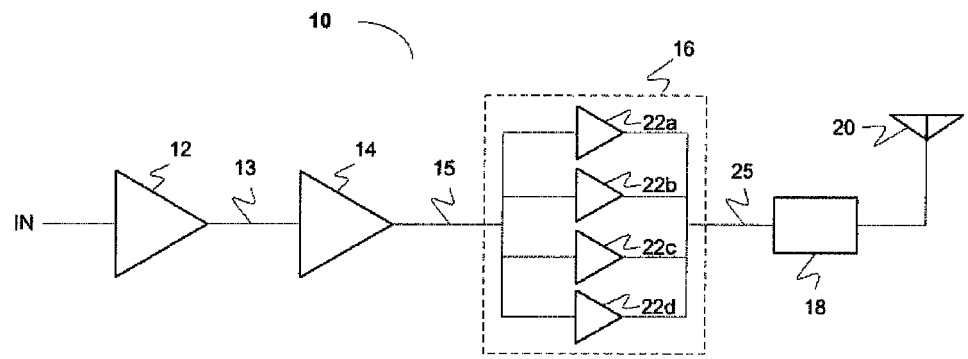
FIG. 1 is a diagram showing an exemplary architecture for the present adjustable, segmented power amplifier.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller, circuit, circuit block and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "time," "rate," and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to" and "in communication with," as well as the terms "lines," "conduits," "traces," "wires," "busses," "signals," "paths" and "channels," but these terms are also generally given their art-recognized meanings. However, the phrases "connected to," "coupled with," "coupled to" and grammatical variations thereof may refer to direct and/or indirect connections and/or couplings, unless the context specifies a more limited meaning. In addition, the term "differential" signal generally refers to a signal transmitted along two separate, but complementary, lines where the value of the data in the signal may be determined at least in part by the difference between the values of voltages or relative voltage levels on the complementary lines. The terms "adjustable," "programmable," "tunable" and "configurable" are also generally interchangeable within the context of this description and generally refer to a circuit or circuit element that has a plurality of possible settings or values, one of which becomes operable, or is fixed or established, in response to a particular state of a single- or multi-bit control signal or memory element(s), but these terms also generally are given their art-recognized meanings.

The present invention concerns an adjustable, segmented power amplifier architecture; adjustable amplifier circuitry; devices and systems including such an amplifier architecture and/or circuitry; and methods for amplifying an analog signal. The amplifier generally comprises (a) a first fixed stage configured to amplify an analog signal and provide a first amplified output at a first common node; and (b) an adjustable stage comprising a plurality of independently selectable parallel amplifier segments, each of the parallel amplifier segments having an input at the first common node and an output at a second common node, wherein the adjustable stage is configured to provide a unique high-efficiency output power range corresponding to a number of selected parallel amplifier segments. In preferred embodiments, the adjustable stage comprises at least four parallel amplifier segments, at least one of which is operable and/or enabled concurrently with the power amplifier, and the remainder of which are each independently enabled and/or selectable for operation.

A further aspect of the invention concerns an integrated circuit architecture, comprising the present adjustable amplifier and a transmitter communicatively coupled to the adjustable amplifier, the transmitter being configured to transmit the analog signal to the adjustable amplifier. An even further aspect of the invention concerns a system, generally comprising the present (integrated) circuit, embodying the inventive concepts described herein.

Even further aspects of the invention concern a method of generating an amplified analog output signal, comprising the steps of (1) amplifying the analog signal in a fixed amplifier stage, (2) selecting a number of parallel amplifier segments for subsequent signal amplification, and (3) amplifying the amplified analog signal with the activated parallel, selectable amplifier segments to generate an output signal in one of a plurality of predetermined output power ranges corresponding to the number of selected parallel amplifier segments.

The invention, in its various aspects, will be explained in greater detail below with regard to exemplary embodiments.

An Exemplary Power Amplifier Architecture

In one aspect, the present invention relates to an adjustable, segmented power amplifier, generally comprising (a) at least one fixed stage configured to amplify an analog signal and provide a first amplified output at a first common node; and (b) an adjustable stage comprising a plurality of independently selectable parallel amplifier segments, each of the parallel amplifier segments having an input at the first common node and an output at a second common node, wherein the adjustable stage is configured to provide a unique high-efficiency output power range corresponding to a number of selected parallel amplifier segments. In one preferred embodiment, the power amplifier output characteristics are substantially insensitive to the number of amplifier segments in the adjustable stage that are selected. In yet further preferred embodiments, the adjustable stage may be programmably sized to maintain an optimal and/or predetermined current density for a given output power range. In addition, preferred embodiments of the present power amplifier contain no digital or CMOS switches of any kind in the signal path. These embodiments (and others) will be explained below in greater detail and with reference to the drawings.

FIG. 1 shows adjustable, segmented power amplifier architecture 10. The architecture shown includes current amplifier 12, fixed predriver 14, adjustable stage 16, matching network 18 and antenna 20. Amplifier 12, fixed predriver 14, and antenna 20 are generally conventional, although matching network 18 may comprise any conventional balun, signal transformer or differential-to-single ended signal converter. As shown in FIG. 1, adjustable stage 16 includes four parallel, independently selectable amplifier segments 22a-22d, although any plural number of stages (i.e., at least two) is encompassed by the present invention. Depending on the target output power range, one or more of the parallel amplifier segments 22a-22d may be selected.

While the embodiment of FIG. 1 shows four parallel amplifier segments 22a-22d, any number of parallel amplifier segments may be implemented. The number of parallel amplifier segments to be included may depend on one or more factors, including the desired output power range, the minimum desired power amp efficiency, the maximum desired gain expansion at low power operation, the desired maximum size/area of the power amp circuitry, the maximum line lengths of inter-stage busses, the minimum signal propagation speed, etc., as described herein. The minimum number of parallel amplifier segments in adjustable stage 16 is two, but a target number of parallel amplifier segments may be defined by the output power range divided by 6 dB. More particularly, the target number of parallel amplifier segments may be $2^n$, where n equals the desired output range divided by 6 dB (which may, in turn, be rounded up to the nearest integer value).

In general, at least one of the parallel amplifier segments 22a-22d in adjustable stage 16 is operable or enabled whenever power amp 10 is operable or enabled (e.g., not powered down). Thus, when adjustable stage 16 comprises n parallel amplifier segments of substantially the same (i) size, (ii) design and/or layout, and/or (iii) gain function, output power and/or power efficiency characteristics, (n−1) of those amplifier segments may be independently selected. In this "same size" or "thermometer code array" embodiment, the characteristics and/or performance matching of the amplifier segments are generally very good.

Alternatively, the parallel amplifier segments 22a-22d in adjustable stage 16 may have different sizes, or some may be the same size while others have a different size. For example, rather than an array of eight parallel amplifier segments of substantially the same size, one may design three amplifier segments such that the output power of a first parallel amp is twice that of a second, and the output power of the third is twice that of the first, giving a kind of digital selectability to the output power of the adjustable stage. Thus, in the case where the parallel amp segments have different sizes, generally at least one of the parallel amp segments will always be enabled, but it may not always be the same segment (as is the preferred ease when all parallel amp segments have substantially the same size).

Figure 2:
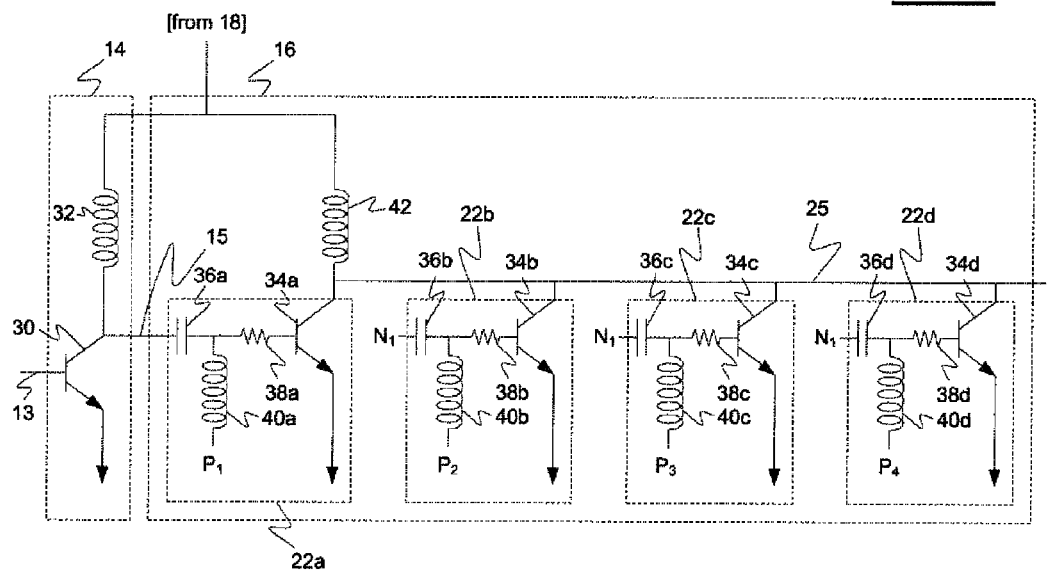
FIG. 2 is a high-level schematic showing an exemplary adjustable stage for the present adjustable, segmented power amplifier.

FIG. 2 shows a simplified schematic for the predriver and output stages of the present power amplifier. While single-ended amplifier stages are shown, the present invention is equally applicable to differential amplifier stages (see the description of FIGS. 8-10 below). Fixed predriver stage 14 generally comprises an NPN bipolar transistor 30 and an inductor 32. However, transistor 30 may comprise any type of bipolar or CMOS transistor, such as a PNP bipolar transistor or an NMOS or PMOS transistor, as may any other bipolar transistor mentioned in this specification, but bipolar transistors are preferred for their speed and sensitivity. Bipolar transistor 30 receives previous stage output 13 at its base, and outputs an amplified signal at node 15, which is received by each of amplifier segments 22a-22d of adjustable stage 16 (i.e., $N_1$=output node 15). Inductor 32 (which may be considered a "choke" inductor) is configured to provide a conventional bias and/or load to predriver output 15, and may provide second-order "low Q" matching from output node 25 to the input of adjustable output stage 16. This is particularly advantageous in high speed and/or high frequency applications (e.g., about 1 GHz or greater, and in one implementation, about 2.4-2.5 GHz).

Each of amplifier segments 22a-22d generally comprises an NPN bipolar transistor 34, a capacitor 36 and a resistor 38 coupled in series to the base of bipolar transistor 34, and an inductor 40 coupled at one end to the node between capacitor 36 and resistor 38 and at the other end to an output $P_1$-$P_4$ from a corresponding bias circuit. An individual amplifier segment 22a, 22b, 22c or 22d may be selected for operation by applying a bias to the corresponding inductor 40. Conversely, an individual amplifier segment 22a, 22b, 22e or 22d may be deselected (or disabled) by not applying a bias to the corresponding inductor 40, and instead, pulling that end of the inductor 40 to ground. Ideally, the bias circuit output current $P_1$-$P_4$ will be substantially the same for any of amplifier segments 22a-22d that are selected or enabled, in the embodiment where each of amplifier segments 22a-22d are substantially the same. Coupling inductor 42 is intended to provide a conventional load onto adjustable stage output 25 and/or resonate adjustable stage output 25 with an output matching network (to be described in greater detail with respect to FIG. 5).

Each of capacitors 36a-d receive the predriver stage output 15 (i.e., N1=output node 15) and, in conjunction with inductor 32 and a corresponding inductor 40a-d, provides a "stepped-down" signal to a corresponding transistor 34a-d. Resistors 38a-d generally serve as "ballast" resistors, to stabilize the load on the base of the corresponding transistor 34. Resistors 38a-d are configured such that the Q of resonant circuit between inductors 40a-d and the $C_7$, (i.e., the emitter-base capacitance) at capacitors 36a-d is sufficiently low to enable the interstage matching between the predriver stage output 15 and the bases of transistors 34a-d to be substantially unaffected when one or more additional amplifier segments 22a-d are turned on or off (assuming at least one of amplifier segments 22a-d are always on). $C_\pi$ of capacitors 36a-d changes depending on the number of amplifier segments 22a-d that are on, but the Q is generally sufficiently low to enable the interstage matching to be relatively stable (i.e., substantially insensitive to the number of selected amplifier segments 22a-d).

Inductors 40a-d are configured to resonate the $C_\pi$ at the base of transistors 34a-d (or, alternatively, the $C_{GS}$, or gate-source capacitance, of a corresponding MOSFET transistor), which can be relatively large in the single amplifier segment case, with the frequency of output signal 25, which can be quite high (on the order of 1-10 GHz, and in one implementation, about 2.4 GHz). As a result, a relatively small inductance should be designed into the input of the final amplifier stage. In such applications, where the fixed amplifier stages are relatively large, if a single inductor is coupled directly to the final stage input, it could be quite challenging to design and/or lay out an inductor with a sufficiently small inductance; e.g., the inductance of the routing/wiring to the inductor could dominate that of the inductor itself. Thus, another advantage of the present power amp architecture is that each parallel amp segment 22i can be configured with its own inductor 40i, thereby enabling effective coupling through use of the inductor 40i and the routing/wiring thereto.

Figure 3:
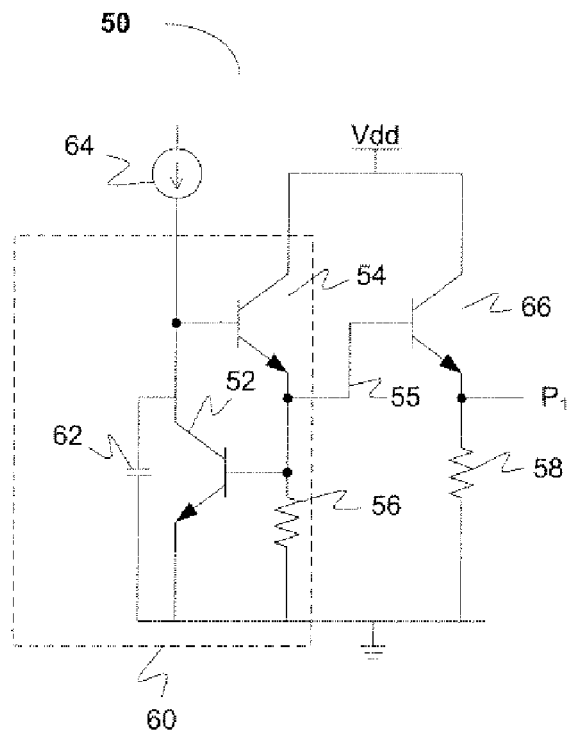
FIG. 3 is a schematic showing an exemplary bias circuit for the adjustable stage of the present amplifier.

FIG. 3 shows an exemplary bias circuit 50, configured to provide amplifier segment 22a (see FIG. 2) with a corresponding bias current $P_1$. Although any conventional bias generator can be employed with the present power amplifier, exemplary bias circuit 50 has some particular advantages for the present amplifier architecture.

A current mirror 60 comprises (i) a first leg, including current source 64, NPN bipolar transistor 52 and capacitor 62, and (ii) a second leg including NPN bipolar transistor 54 and resistor 56. Current source 64 is conventional, and may comprise a digitally programmed current source that includes a conventional digital-to-analog converter (DAC), configured to provide a programmable current to current mirror 60. The programming of the DAC (and thus, the amount of current provided by current source 64) corresponds to and/or depends on the number of amplifier segments 22a-22d that are selected for operation. Transistor 52 is effectively a diode-connected device, and resistor 56 is configured to keep transistor 52 on (a so-called "bleeder" resistor). Transistor 54, which receives the output of current source 64 (along with the emitter of transistor 52), is configured to provide current to the base of transistor 52. Generally, the node between capacitor 62 and current source 64 is the dominant pole of current mirror 60, and node 55 (more specifically, the capacitance thereof) is the non-dominant pole.

To ensure the predictability and stability of output power efficiency independent of the number of amplifier segments 22a-22d that are selected for operation, bias circuit 50 comprises a third leg, including resistor 58 and emitter follower NPN transistor 66, which receives as an input to its base the current mirror output signal at the node 55 between the emitter of transistor 54 and resistor 56. The third leg of bias circuit 50 acts as a buffer to improve reverse isolation between current mirror 60 and the bias input $P_1$. The capacitance and/or current at node 55 may vary as a function of the number of selected amplifier segments 22a-d in adjustable stage 16 (see FIGS. 1-2), sometimes to an unacceptably large range of values. Buffering node 55 with an emitter follower device enables one to ensure stability of bias input $P_1$.

As will be explained in greater detail with respect to FIG. 8, in a preferred embodiment, each parallel amplifier segment in the adjustable output stage has at least one unique or corresponding bias generator circuit 50i. When each amplifier segment 22i has its own bias generator circuit 50i, the stability of certain amplifier characteristics and/or parameters independent of the number of active or enabled segments in output stage 16 is improved relative to the case where a single bias generator provides the same bias to each amplifier segment.

Figure 4:
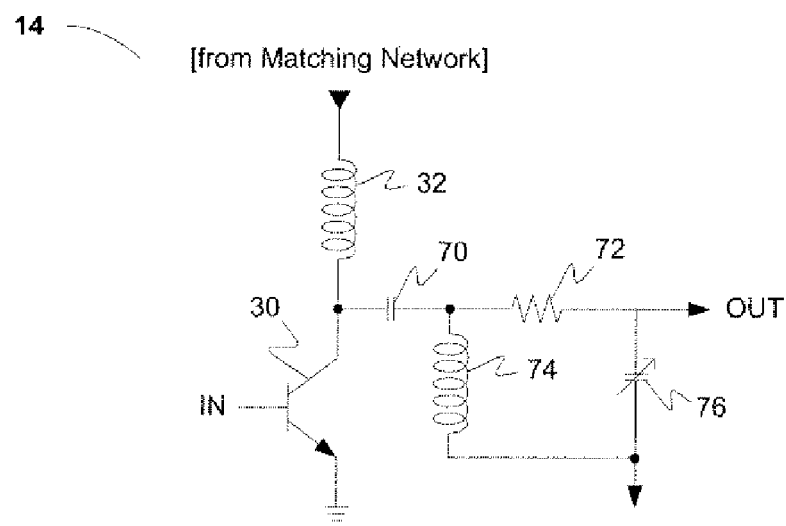
FIG. 4 is a high-level schematic showing an exemplary architecture for a pre-driver stage of the present power amplifier.

FIG. 4 is a schematic showing components of exemplary second (predriver) stage 14 and adjustable stage 16 of power amplifier 10 that can be configured for interstage (input) matching. Predriver stage 14 generally includes NPN bipolar amplifier transistor 30, inductor 32, and predriver output node OUT. Inductor 32 functions as described above with respect to FIG. 2. The input matching circuit generally comprises inductor 32, capacitor 70, resistor 72, inductor 74 and capacitor 76. Inductor 74 and capacitor 76 act as a resonant tank or circuit for the input to adjustable stage 16. Because ballast resistor 72 keeps the Q of the input matching circuit low, the capacitance of capacitor 76 can vary so that the resonance frequency of the transformation network (e.g., signal converter 18, coupled to the amplifier output) and of the resonant tank can be kept relatively constant and insensitive to the number of parallel amplifier segments selected in adjustable stage 16.

An Exemplary Adjustable Power Amplifier Stage with Output Matching

Figure 5:
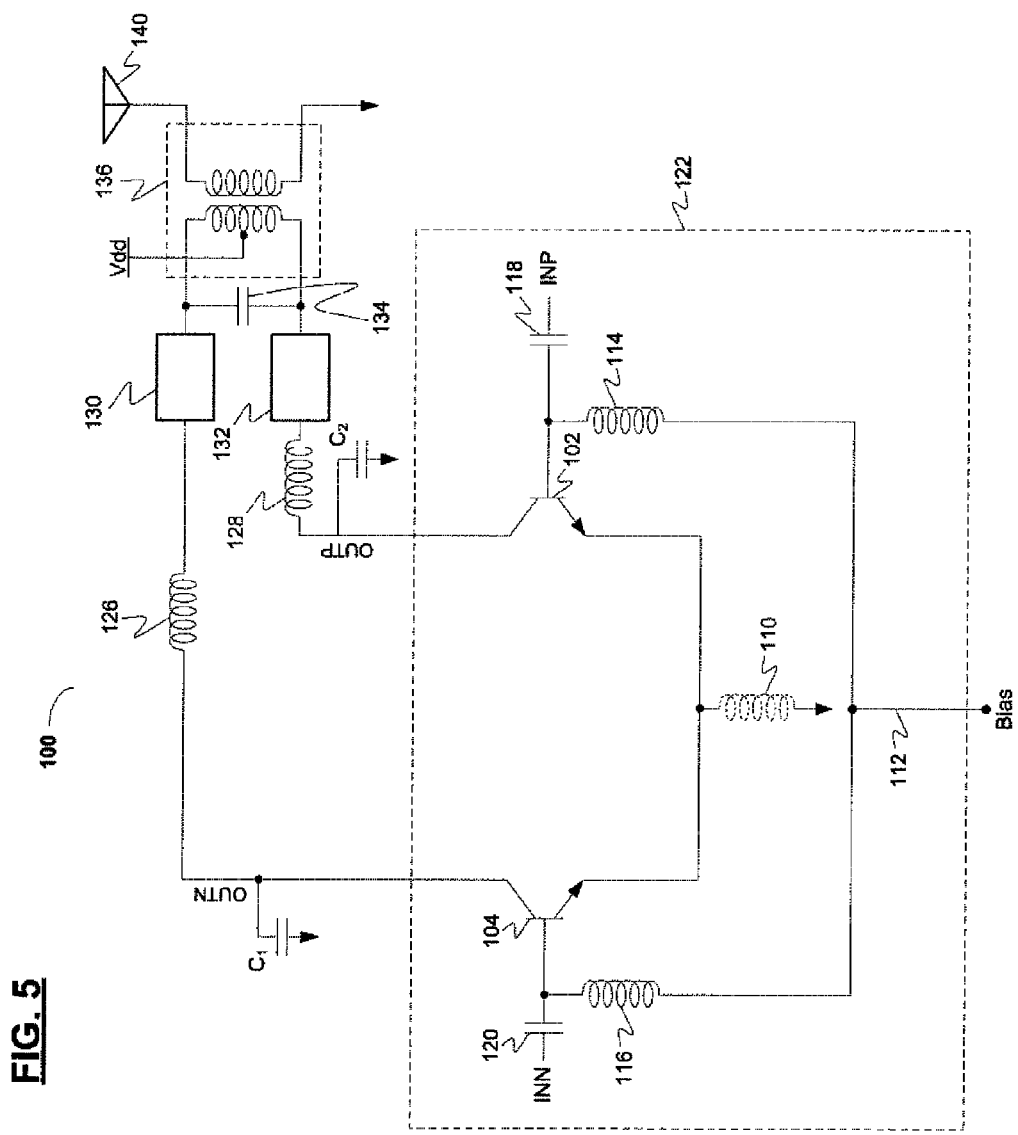
FIG. 5 is a schematic showing an exemplary implementation of a matched output driver receiving an output from the present power amplifier.

FIG. 5 shows an exemplary output driver segment and output matching network 100. Differential output driver segment 122 corresponds to one of parallel amplifier segment 22a-d in FIGS. 1-2. As for the exemplary power amp circuit 10 in FIG. 1, the adjustable output stage 16 may comprise four such differential segments 122 in parallel. Output driver segment 122 generally comprises differential output transistors 102 and 104, differential input matching inductors 114 and 116 (coupled to bias input 112 and which correspond to inductor 40a-d in FIG. 2), and differential input capacitors 118 and 120. The output matching network generally comprises differential output capacitors $C_1$ and $C_2$, output inductors 126 and 128, microstrip transmission lines 130 and 132, capacitor 134, and baton 136 (comprising a center-tapped transformer). Antenna 140 is shown for reference. Inductor 110 represents the inductance of the bond wire to a ground potential.

A differential input signal INN/INP is applied to coupling capacitors 118 and 120. Differential output transistors 102 and 104 are preferably NPN bipolar transistors, as shown in FIG. 5. However, as described above, transistors 102 and 104 may comprise any type of bipolar or CMOS transistor, such as a PNP bipolar transistor, or an NMOS or PMOS transistor. Transistors 102 and 104 may each comprise a single transistor, or multiple transistors in parallel, with commonly-coupled control gates, electron sources and outputs. As described above, differential input matching inductors 114 and 116 are communicatively coupled to, and preferably configured to receive, a bias 112. In one embodiment, bias 112 is the bias current output $P_1$ from exemplary bias circuit 50 (see FIG. 3).

Since there are multiple output driver segments 122 coupled to output nodes OUTN and OUTP, the capacitance at output nodes OUTN and OUTP will change slightly as a function of the number of output driver segments selected for operation. Thus, the "low Q" output matching network comprises capacitors $C_1$ and $C_2$ to reduce the effect that a variable number of selected output segments has on output node capacitance, thereby optimizing the output matching network for substantially constant operational characteristics and/or performance, independent of the number of adjustable output stage segments that are selected for operation. As a result, the present power amplifier may further comprise a "low Q" and/or "π-matched" output matching network that is substantially insensitive to signal routing parasitics, variations in processing technology, and/or the number of selected parallel output amplifier stages.

The balance of the output matching network (as well as the balance of the output signal path from output driver 122 to signal converter 136) generally comprises output inductors 126 and 128, microstrip transmission lines 130 and 132, and differential capacitor 134. Output inductors 126 and 128 generally represent the inductances of the bond wires and package lead(s) corresponding to the output signal OUTN/OUTP. Where capacitors $C_1$ and $C_2$ may form one end (the "step-down" end) of a "low Q, π-matched" impedance matching network across inductors 126 and 128, differential capacitor 134 forms the other end (the "step-up" end).

Figure 6A:
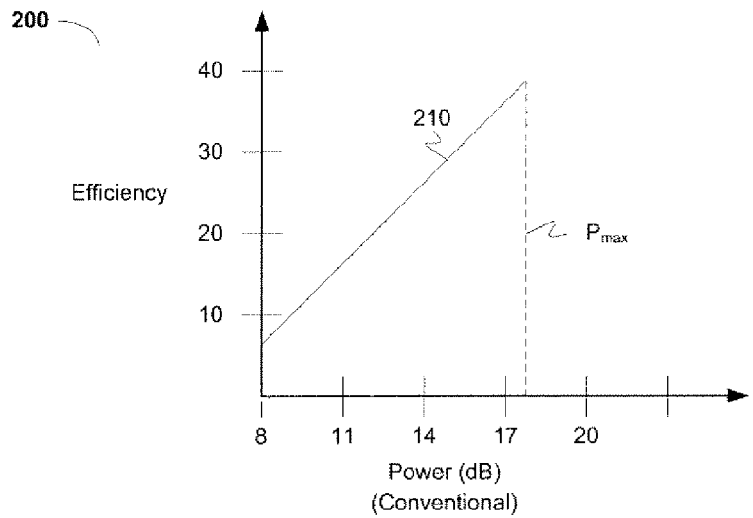
FIGS. 6A-6B are graphs plotting amplifier efficiency as a function of power for an embodiment of the present power amplifier (FIG. 3B) and an otherwise identical power amplifier having an equal number of fixed stages (FIG. 3A).
Figure 6B:
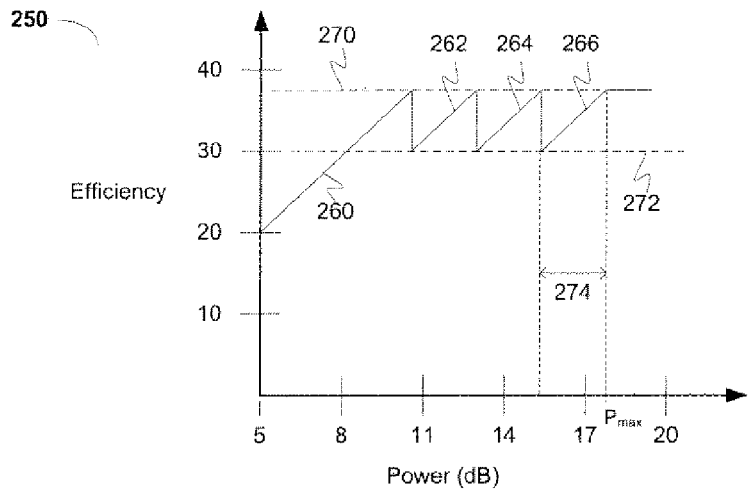

FIGS. 6A and 6B compare the power efficiencies of otherwise identical single-segment (FIG. 6A) and four-segment output stage power amps, as a function of output power. In the single-segment output stage case (graph 200, FIG. 6A), efficiency reaches a maximum $P_{max}$ at just under 40% at about 18 dB output power. As shown by line segment 210, efficiency decreases linearly with decreasing power down to 8 dB. The very low efficiencies at relatively low output power are a result of relatively high quiescent currents in the amplifier stages during low power operation.

As shown by graph 250 in FIG. 6B, the present power amp architecture provides essentially the same maximum efficiency 270 at the same output power $P_{max}$ as the single-segment final stage (configured to provide the same output power as the maximum power provided by the exemplary four-segment design). Furthermore, line segment 260 shows that power efficiency in the present architecture also decreases linearly with decreasing power. However, at a certain predetermined reduction in efficiency 272 and/or detected output power 274, one of the parallel segments 22a-d in the present architecture 10 (see, e.g., FIG. 1) turns off, thereby increasing the efficiency back to the maximum 270, but this time at a different output power. As the output power and efficiency decrease further along line segment 264, at the predetermined reduction in efficiency 272 and/or detected output power another of the parallel segments 22a-d turns off, and the efficiency jumps back to the maximum 270, this time at third output power different from the first two output powers at which maximum efficiency is reached. This process and/or phenomenon are repeated along line segment 262. However, line segment 260 represents the power efficiency-vs.-output power graph for a single active/enabled segment of the four parallel amp segments 22a-d in adjustable output stage 16. As a result, the efficiency shown in line segment 260 continues to decrease as a function of output power even after the predetermined reduction in efficiency 272 and/or detected output power is reached. In the preferred embodiment of FIG. 6B, each of parallel amplifier segments 22a-d is substantially the same as the other parallel amplifier segments.

In one implementation, each doubling of the number of output amplifier segments selected for operation increases the output power by 6 dB. Thus, the power amplifier 10 of FIGS. 1-2, having four parallel output amplifier segments, increases the operational output power range for minimally efficient operation by 12 dB, a commercially significant increase in a relatively low power application, such as wireless communications.

An Exemplary Integrated Circuit

In another aspect, the present invention concerns an integrated circuit (IC) that includes an adjustable amplifier, such as the exemplary architecture of FIG. 1 or the exemplary circuitry of FIGS. 2-5. In a preferred embodiment, the integrated circuit comprises the present adjustable amplifier, and a transmitter communicatively coupled to the adjustable amplifier, the transmitter being configured to transmit the analog signal to the adjustable amplifier. The present integrated circuit is particularly suitable for high-speed, wireless applications. As a result, the analog signal transmitted and/or amplified by the present IC may have a frequency of from about 600 KHz to about 6 GHz. Furthermore, in various embodiments, the present integrated circuit comprises a transceiver compatible with and/or configured to communicate data in substantial accordance and/or compliance with a protocol defined and/or described in the Institute of Electrical and Electronic Engineers (IEEE) 802.11, 802.11a, 802.11b, 802.11g, 802.11h, 802.11i, 802.11n and/or 802.16 standards.

Figure 7:
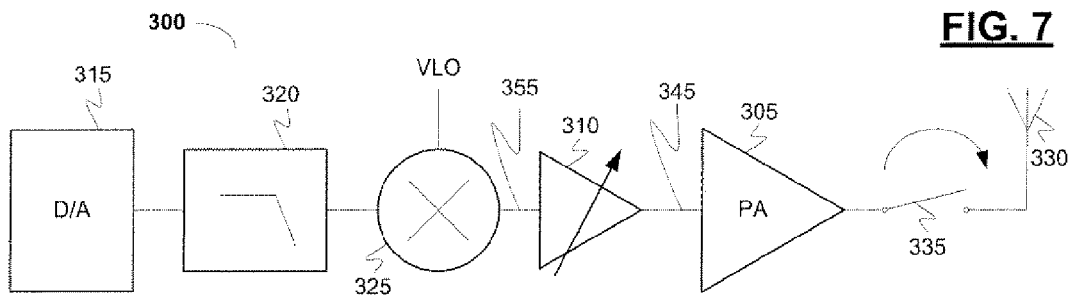
FIG. 7 is a block diagram of a transmitter for a wireless network employing the present power amplifier.

FIG. 7 shows a block diagram of an 802.11G-compatible and/or -compliant RF transmitter system 300, into which the exemplary power amplifier may be integrated. The input 345 to power amp PA 305 is the output current of variable gain amplifier (VGA) block 310. RF transmitter system further includes, in series, a digital-to-analog (D/A) converter 315, a filter 320, and an RF mixer 325, which provides the signal input into VGA block 310. Mixer 325 also receives a local oscillator voltage signal VLO, by which the output of filter 320 is multiplied to provide VGA input 355. Antenna 330 is the load (which, in one implementation, is 50Ω) that is driven through the switch 335 and an external matching network (see, e.g., FIG. 5 and the description thereof supra).

While transmitter system 300 is discussed in the context of an integrated circuit, certain components (such as antenna 330, balun 335 and the external matching network) are not necessarily included in the same monolithic device as other components (such as PA 305 VGA block 310, D/A converter 315, a filter 320, and RF mixer 325). Even those components that are typically included in a monolithic semiconductor device may be included on separate or discrete devices.

Thus, the present IC may comprise further components such as a digital-to-analog (D/A) converter, a modulator or low pass filter, a mathematical logic operation block such as an adder or multiplier, and a variable gain amplifier. The mathematical logic operation block may receive a control or reference signal, such as an oscillator output, on which the output of the modulator or low pass filter is mathematically operated to provide the VGA input. Thus, such further components may be configured in series, in the order listed above.

The System and a Wireless Network

In a further aspect of the present invention, the system is configured to broadcast an analog signal. The system generally comprises the above-described integrated circuit, a signal converter configured to provide a converted analog output signal from the output signal of the adjustable amplifier, and a transmission antenna configured to broadcast the converted analog output signal. In one embodiment (and as described above), the signal converter may comprise a transformer.

The present system generally includes elements of the output matching network described above with regard to FIG. 5. Thus, in one embodiment, the system further comprises an output capacitor and/or an output inductor coupled to the second common node; an adjustable resistor coupled to the output inductor (or to the second common node in the absence of the output inductor). Preferably, the system further comprises at least the output capacitor and the output inductor coupled to the second common node.

In yet further embodiments of the system, the output signal may comprise a differential signal, and the signal converter may be configured to convert the differential signal to a single-ended signal. In such differential output embodiments, the system may further comprise first and second output capacitors and/or first and second output inductors, respectively coupled to each line of the differential output signal, and/or a differential output capacitor, respectively coupled to each line of the differential output signal. Preferably, the differential output system further comprises at least a first output capacitor and a first output inductor coupled to a first differential output signal line, a second output capacitor and a second output inductor coupled to a second differential output signal line, and the differential output capacitor in communication with the ends of the first and second output inductors opposite those coupled to the differential output signal lines.

The present invention also relates to a network, comprising the present system, and a receiver in electromagnetic communication with the system. Since the present invention enjoys particular applicability to wireless data (and, alternatively, voice and/or video) communications, the network may further comprise a receiving antenna in communication with the receiver.

Alternatively, the network may comprise a plurality of the present systems, and a plurality of receivers, each of the receivers being in communication with at least one of the systems. In such a network, at least one of the systems is in communication with at least two of the receivers and/or at least two of the systems are in communication with at least one of the receivers.

An Exemplary Method

The present invention further relates to a method of amplifying an analog signal, comprising the steps of (a) amplifying the analog signal in a fixed amplifier stage; (b) selecting a number of parallel amplifier segments for subsequent signal amplification; and (c) amplifying the amplified analog signal with the activated parallel, selectable amplifier segments to generate an output signal in a unique output power range corresponding to the number of selected parallel amplifier segments.

While the operation of the present power amplifier circuitry is generally described above, in one implementation, the selecting step comprises applying a bias to those amplifier segments that are to be selected. In further embodiments, the value of the bias corresponds to the number of selected amplifier segments, the bias may be generated from a programmable current, and/or the method may further comprise determining a value of the programmable current based on the number of selected amplifier segments.

Alternatively or additionally, the present method may further comprise the step(s) of generating the bias (which may take the form of a bias current or a bias voltage) and which may be generated independently for each selected parallel amplifier segment; matching the output signal frequency to each of the parallel amplifier segment inputs; and/or broadcasting the output signal.

Furthermore, and as explained in greater detail above, the output signal may have a minimum power efficiency when two or more of the parallel amplifier segments are selected, and that minimum power efficiency may be at least 50% (preferably at least 60%) of the maximum efficiency of an amplifier circuit including the present fixed and adjustable stages (including the parallel amplifier segments). In various embodiments, the output signal may have a minimum frequency of about 1 GHz, about 2.4 GHz, or about 5 GHz.

An Exemplary Implementation

Figure 8:
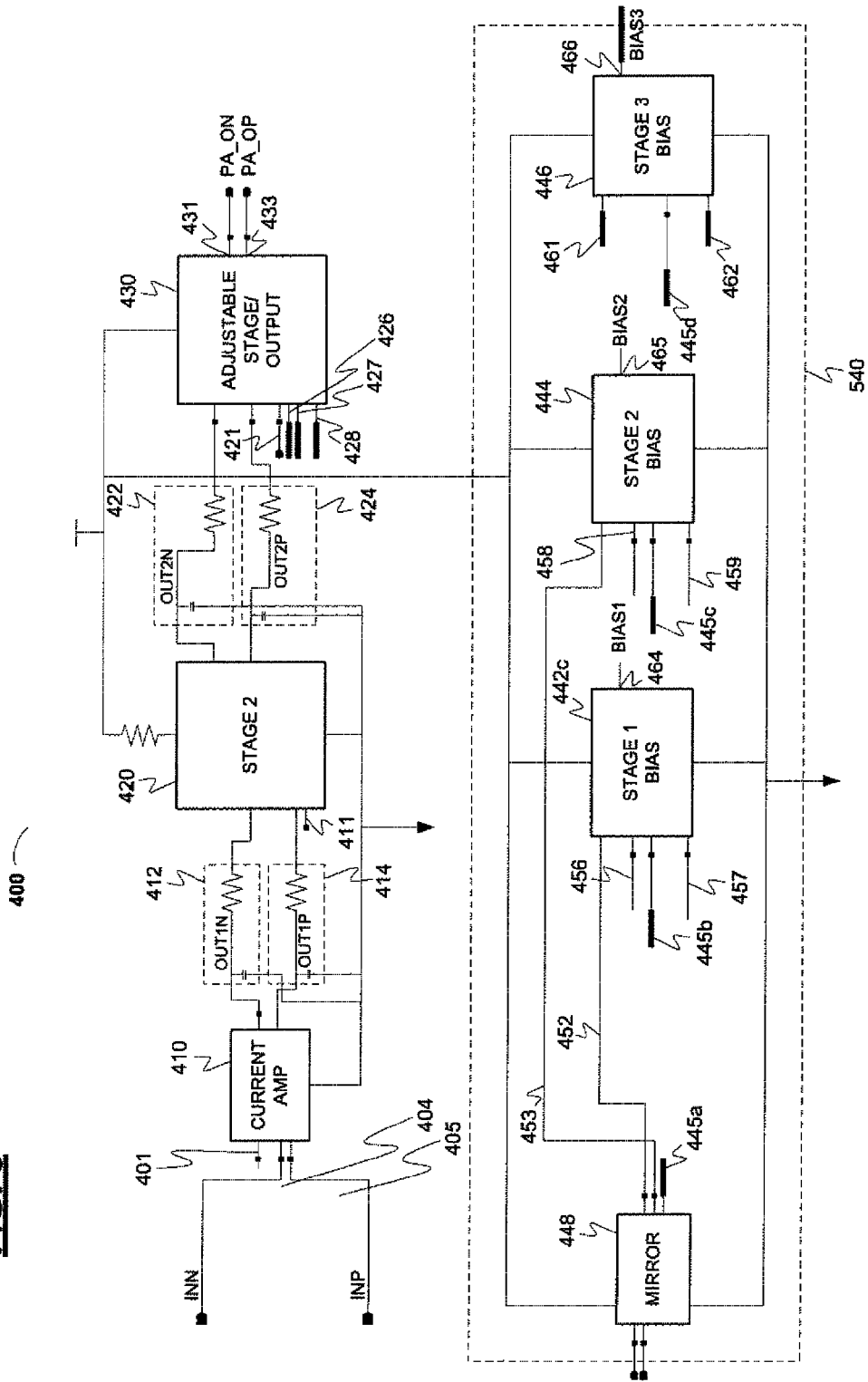
FIG. 8 is a block diagram of an exemplary power amplifier for the transmitter of FIG. 7.

FIG. 8 shows a block diagram of an implementation of the present power amplifier PA. The exemplary PA implementation 400 of FIG. 8 is a fully differential design, and relies on a balun external to the PA (and optionally external to the integrated circuit that includes the PA; see FIG. 7 and the corresponding discussion above) to convert the differential PA output to a single-ended signal. The primary functional blocks or power amp 400 include current amplifier 410, power amp second stage 420, differential output signal generator (adjustable PA stage) 430 and bias section 440. Power amp second stage 420 is, in this implementation, an inductively loaded common emitter amplifier. In this implementation, adjustable power amp third stage 430 is an open-collector common emitter differential amplifier.

Bias section 440 generally includes stage 1 bias circuit 442, stage 2 bias circuit 444, stage 3 bias circuit 446 and current mirror 448. Current mirror 448 provides reference currents (which may be the same or different) to stage 1 bias circuit 442 on line 452 and stage 2 bias circuit 444 on line 453. In this implementation, current mirror 448 is a conventional bipolar current mirror, and as such, will not be further described. Complementary reference bias signals (e.g., positive and negative, or n and p) are provided to first stage 1 bias circuit 442 on lines 456 and 457, stage 2 bias circuit 444 on lines 458 and 459, and stage 3 bias circuit 446 on lines 461 and 462. Stage 1 bias circuit 442a generates stage 1 bias signal BIAS1 at output 464. Stage 2 bias circuit 444 generates stage 2 bias signal BIAS2 at output 465. Stage 3 bias circuit 446 generates stage 3 bias signal BIAS3 at output 466. The present power amplifier may be configurable, and some or all of the power amplifier configuration bits may be input into current mirror 448 and the stage 1, 2 and 3 bias circuits 442, 444 and 446 at inputs 445a-d, respectively.

Current amplifier 410 receives differential input signals INN and INP on differential input bus 404-405 and stage 1 bias signal BIAS1 at input 401. Current amplifier 410 provides a differential output signal OUT1N/OUT1P that serves as an input to the power amp second stage 420 after filtering through RC circuits 412 and 414. Second stage 420 (shown in greater detail in FIG. 9) also receives stage 2 bias signal BIAS2 at input 411 and generates a differential output signal OUT2N/OUT2P that serves as an input to the power amp adjustable third stage 430 after filtering through RC circuits 422 and 424.

In this implementation, power amp differential output signal generator (adjustable stage) 430 includes four amplifiers in parallel, as described above and shown in FIGS. 1 and 2. Referring back to FIG. 8, adjustable stage 430 also receives stage 3 bias signal BIAS3 at input 421 and second, third and fourth parallel amp selection/enable signals at inputs 426, 427 and 428, respectively. The state of each digital parallel amp selection/enable signal is independent of the others, and is determined by the value of the output power as measured by a power detector (not shown). For power amp operability, at least one of the four parallel amplifiers in adjustable stage 430 must be enabled at all times; as a result, no independent enable signal is necessary for the first parallel amp in the adjustable stage. Adjustable stage 430 provides differential power amp output signals PA_ON and PA_OP.

Figure 9:
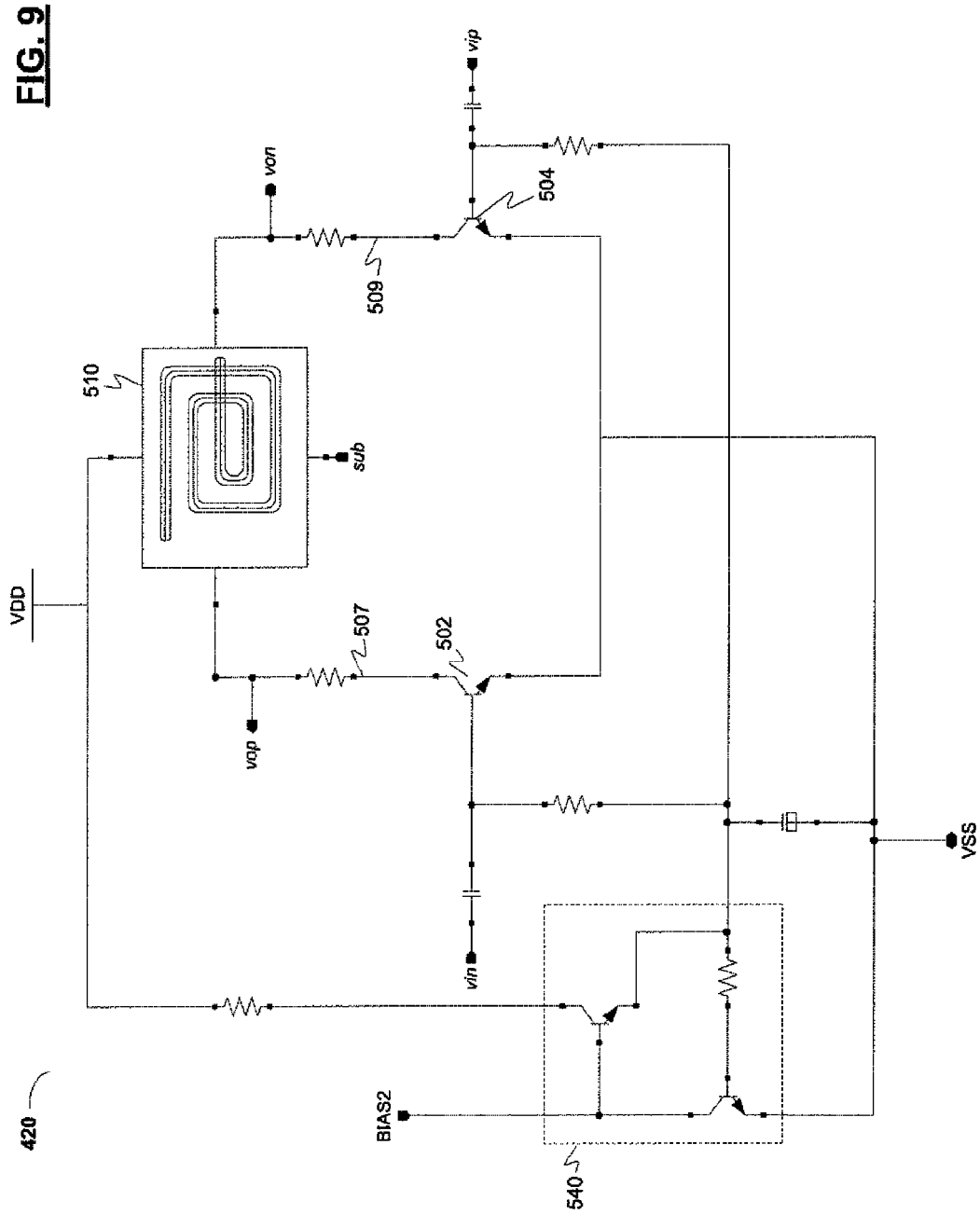
FIG. 9 is a schematic of exemplary predriver circuitry for the power amplifier of FIG. 8.

FIG. 9 shows second stage 420 in greater detail. Second stage 420 is a common emitter stage with inductive loading. Bipolar transistors 502 and 504, which receive differential input signal vin/vip at their respective bases, form a common emitter differential amplifier pair. Inductor 510 is a differential, center-tapped inductor that serves as the load for second stage 420. A bias current BIAS2 from a second stage bias generator (see stage 2 bias circuit 444 in FIG. 8) is input into current mirror 540 to generate an intrastage bias that is applied through a pair of resistors to the differential input vin/vip.

Figure 10:
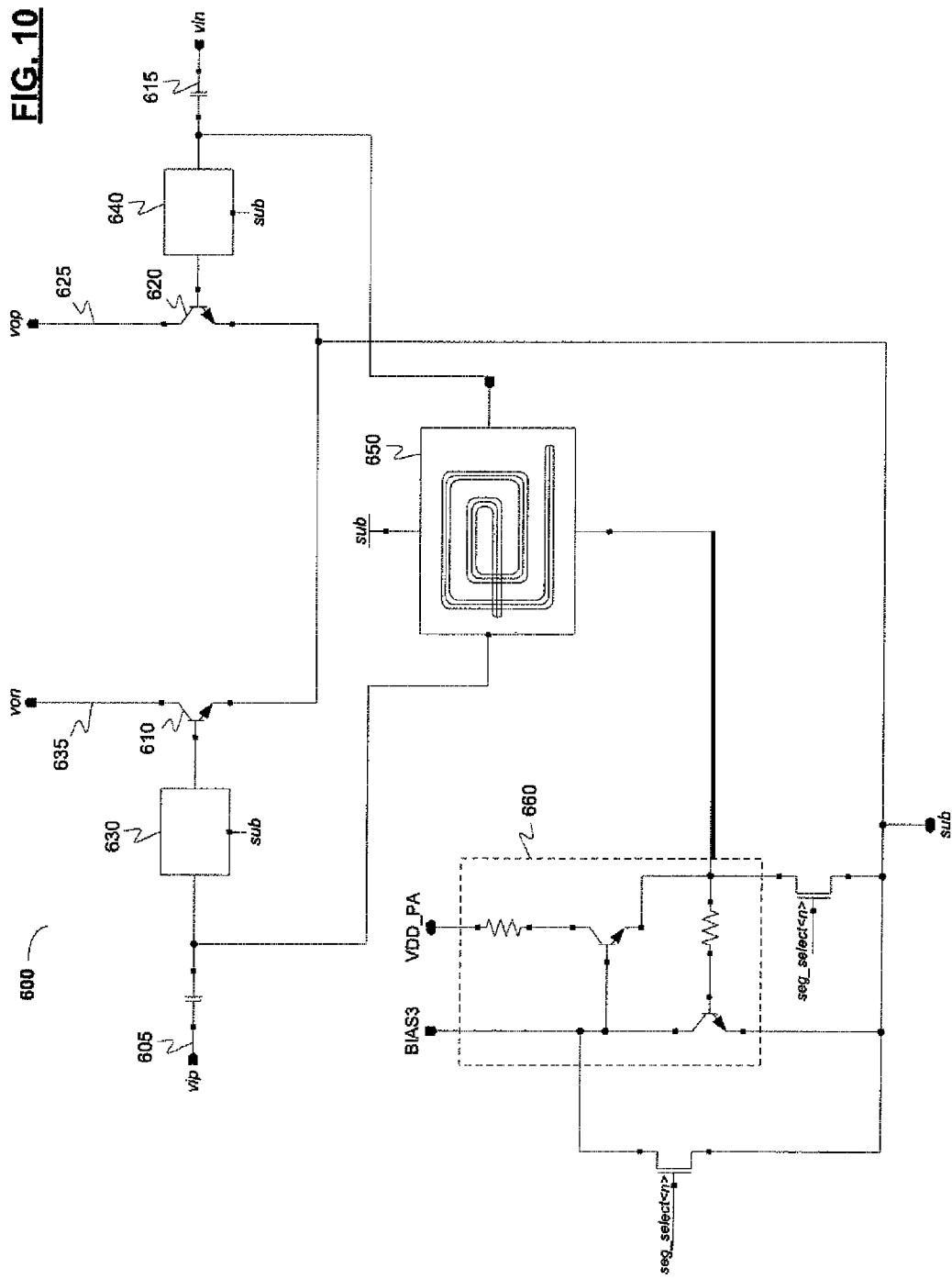
FIG. 10 is a schematic of exemplary output circuitry suitable for use in conjunction with the present invention.

FIG. 10 shows one parallel amplifier segment 600 of adjustable stage 430 in greater detail. Note that adjustable stage 430 includes four such amplifier segments 600 in parallel, commonly coupled to differential input nodes vip 605 and vin 615 and differential output nodes vop 625 and von 635. One, two, three or four of the parallel amplifier segments 600 may be enabled for use, depending on the target output power. Bipolar transistors 610 and 620 form an open collector differential pair. The bases of transistors 610 and 620 are ballasted by resistor arrays 630 and 640 to prevent current collapse due to a non-uniform current distribution in output devices 610 and 620.

Center-tapped inductor 650 is configured to serve two functions: (1) to supply current to, and (2) to resonate with the capacitance at, the bases of output devices 610 and 620. By resonating with the base capacitance of the output devices, inductor 650 helps to present a real and higher impedance termination for the inter-stage matching network (see, e.g., FIG. 4 and the corresponding description above). Due to the low Q of the resonant circuit at the inputs of the output devices 610 and 620, second stage 420 generally drives a low impedance, which is typically difficult to match at relatively high output power levels. To mitigate this problem, an impedance transform is implemented by an L-match in the inter-stage matching network.

Impedance matching in the present power amp may be accomplished by adjusting the length of the microstrip transmission lines 130/132 (see FIG. 5) with a sliding capacitor. Under nominal conditions, the 50Ω antenna impedance can be transformed to any real impedance within a predetermined range. This allows for tuning in the event that the power amp characteristics do not match simulations.

The adjustable stage of this exemplary power amplifier has a distinct class of operation, as determined by the conduction angle of each half of the differential pair of output transistors 610 and 620 (see Table 1 below). Each of the current amplifier stage and the predriver (second) stage operate in class A, corresponding to a 360° conduction angle.

TABLE 1

Operational class conduction angles.

| Class of Operation | Conduction Angle |
|---|---|
| A | 360° |
| AB | 180° < x < 360° |
| B | 180° |
| C | <180° |

It was determined through simulation and theory that the best linearity could be realized by class AB amplifier operation in the adjustable stage 430 (see FIG. 8). This was a result of balancing the strong and weak non-linearities of the output devices 610 and 620 (see FIG. 10). If the output devices 610 and 620 have a sufficiently high conduction angle (e.g., about) 360°, then the amplifier will exhibit monotonically decreasing gain with input amplitude. If the output devices 610 and 620 have a low conduction angle (e.g., ≦180°), then the amplifier will exhibit gain expansion at relatively small input amplitudes and gain compression at relatively large input amplitudes. The optimal class AB bias point balances the effects of gain expansion and gain compression to achieve the largest linear range of operation. The increased P1 dB as compared to a class A amplifier comes at the expense of lower small amplitude signal gain. The conduction angle of the output stage may be programmed by setting a programmable current source in the power amp stage 3 bias circuitry 446 (see FIG. 8).

CONCLUSION/SUMMARY

Thus, the present invention provides an adjustable, segmented amplifier, systems including such an amplifier, and methods for amplifying an analog signal using such an amplifier. The amplifier generally comprises (a) a first fixed stage configured to amplify an analog signal and provide a first amplified output at a first common node; and (b) an adjustable stage comprising a plurality of independently selectable parallel amplifier segments, each of the parallel amplifier segments having an input at the first common node and an output at a second common node, wherein the adjustable stage is configured to provide an output signal in one of a plurality of power ranges corresponding to the number of selected parallel amplifier segments. The systems generally comprise an integrated circuit (IC) that includes the present amplifier. The methods generally comprise the steps of (1) amplifying the analog signal in a fixed amplifier stage, (2) selecting a number of parallel amplifier segments for subsequent signal amplification, and (3) amplifying the amplified analog signal with the activated parallel, selectable amplifier segments to generate an output signal in one of a plurality of predetermined output power ranges corresponding to the number of selected parallel amplifier segments. The present invention advantageously provides a power amplifier that operates efficiently over a large output power range, that exhibits unconditional stability over a wide output power range, and that does not consume an inordinate amount of chip area. Furthermore, in certain preferred embodiments, the present amplifier exhibits excellent input and/or output matching and/or an insignificant and/or immaterial degree of parameter variability, regardless of the number of parallel output segments that are selected for operation.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An adjustable, segmented amplifier architecture, comprising:
a first fixed stage configured to
amplify an analog signal in accordance with a fixed amplification, and
provide the analog signal amplified in accordance with the fixed amplification to a first common node;
an adjustable stage in communication with the first fixed stage, the adjustable stage comprising a plurality of independently selectable parallel amplifier segments, each of the parallel amplifier segments having (i) an input at the first common node and (ii) an output at a second common node, wherein the adjustable stage is configured to amplify the analog signal provided to the first common node in accordance with an adjustable amplification that is adjustable depending upon a number of the independently selectable parallel amplifier segments having been selected to amplify the analog signal provided to the first common node, and provide the analog signal amplified in accordance with the fixed amplification and amplified in accordance with the adjustable amplification to the second common node; and a matching network coupled to the first fixed stage and to the adjustable stage, wherein the matching network is configured to receive an output signal in one of a plurality of power ranges corresponding to the selected number of the independently selectable parallel amplifier segments.

2. The adjustable, segmented amplifier architecture of claim 1, wherein the adjustable stage provides the output signal in one of the plurality of power ranges corresponding to the selected number of the selectable parallel amplifier segments.

3. The adjustable, segmented amplifier architecture of claim 1, wherein the plurality of independently selectable parallel amplifier segments comprises $2^n$ parallel amplifier segments, wherein n equals a predetermined output power range divided by 6 dB.

4. The adjustable, segmented amplifier architecture of claim 1, further comprising a second fixed stage in communication with the first fixed stage, wherein the second fixed stage is configured to amplify the analog signal in accordance with a second fixed amplification prior to first fixed stage amplifying the analog signal.

5. The adjustable, segmented amplifier architecture of claim 1, further comprising an inductor to provide i) a bias and/or load to the fixed stage, and ii) a second-order low Q matching from the second common node to the first common node.

6. The adjustable, segmented amplifier architecture of claim 1, further comprising an inductor to:

provide a load onto the second common node; or resonate the second common node with the matching network.

7. The adjustable, segmented amplifier architecture of claim 1, wherein the first fixed stage comprises:

a resistor in electrical communication with a capacitor;

an inductor;

a variable capacitor; and the first common node, wherein the inductor and the variable capacitor act as a resonant tank or circuit, and the resistor is configured such that a Q of an input matching circuit is sufficiently low to permit an interstage matching between i) the first fixed stage and ii) the adjustable stage to be substantially unaffected when one or more the parallel amplifier segments are selected or deselected.

8. The adjustable, segmented amplifier architecture of claim 7, wherein each of the parallel amplifier segments further comprises a bias circuit in electrical communication with the inductor.

9. The adjustable, segmented amplifier architecture of claim 1, further comprising a selector to select at least one of the plurality of parallel amplifier segments for operation.

10. A radio frequency (RF) transmitter comprising the adjustable, segmented amplifier architecture of claim 1.

11. The adjustable, segmented amplifier architecture of claim 1, wherein each of the parallel amplifier segments further comprises a differential output amplifier.

12. The adjustable, segmented amplifier architecture of claim 11, wherein each differential output amplifier comprises a plurality of transistors in parallel, having commonly-coupled control gates, current sources and outputs.

13. The adjustable, segmented amplifier architecture of claim 1, wherein the matching network further comprises one or more microstrip transmission lines, wherein lengths of the transmission lines are adjusted to match an impedance in the amplifier with a sliding capacitor.

14. The adjustable, segmented amplifier architecture of claim 1, wherein the fixed stage comprises a first bipolar transistor and each of the plurality of parallel amplifier segments comprises a second bipolar transistor.

15. The adjustable stage of claim 1, wherein the outputs of the parallel amplifier segments are summed at the second common node.

16. The adjustable stage of claim 1, wherein each of the transistors comprises a bipolar junction transistor.

* * * * *